(12) United States Patent  
Outaleb

(10) Patent No.: US 9,030,260 B2
(45) Date of Patent: May 12, 2015

(54) DUAL-BAND HIGH EFFICIENCY DOHERTY AMPLIFIERS WITH HYBRID PACKAGED POWER DEVICES

(71) Applicant: Alcatel-Lucent Canada Inc., Ottawa (CA)

(72) Inventor: Noureddine Outaleb, Ottawa (CA)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 13/946,369

(22) Filed: Jul. 19, 2013

(65) Prior Publication Data

US 2015/0022270 A1 Jan. 22, 2015

(51) Int. Cl.
*H03F 3/68* (2006.01)
*H03F 3/19* (2006.01)
*H03F 3/193* (2006.01)
*H03F 3/21* (2006.01)

(52) U.S. Cl.
CPC .................. *H03F 3/19* (2013.01); *H03F 3/193* (2013.01); *H03F 3/21* (2013.01)

(58) Field of Classification Search
USPC .......................... 330/295, 124 R, 53, 84, 286
See application file for complete search history.

(56) References Cited

U.S. PATENT DOCUMENTS

| | | | | |
|---|---|---|---|---|
| 7,817,973 | B1 * | 10/2010 | Tuo .............................. | 455/126 |
| 8,502,599 | B2 * | 8/2013 | Conradi ....................... | 330/126 |
| 2011/0279178 | A1 | 11/2011 | Outaleb et al. | |
| 2013/0106517 | A1 | 5/2013 | He et al. | |

OTHER PUBLICATIONS

Hualing Zhang et al., A Stub Tapped Branch-Line Coupler for Dual-Band Operations, IEEE Microwave and Wireless Componenets Letters, vol. 17, No. 2, Feb. 2007, pp. 106-108.
Paul Saad et al., Design of a Concurrent Dual-Band 1.8-2.4-GHz GAN-HEMT Doherty Power Amplifier, IEEE Transactions on Microwave Theory and Techniques, vol. 60, No. 6, Jun. 2012.
Xiang Li et al., A Concurrent Dual-Band Doherty Power Amplifier, Proceedings of Asia-Pacific Microwave Conference 2010, pp. 654-657.
Paolo Colantonio et al., A Design Technique for Concurrent Dual-Band Harmonic Tuned Power Amplifier, IEEE Transactions on Microwave Theory and Techniques, vol. 56, No. 11, Nov. 2008, pp. 2545-2555.
Bumman Kim et al., The Doherty Power Amplifier, IEEE Microwave Magazine, Oct. 2006, pp. 42-50.
Paolo Colantonio et al., Design of a Dual-Band GAN Doherty Amplifier, Electriconic Engineering Department University of Roma Tor Vergata, Italy.
Paolo Colantonio et al., The Doherty Power Amplifier, Advanced Microwave Circuits and Systems, 2010, pp. 108-132.
Written Opinion of the International Searching Authority PCT/ISA/237 and International Search Report PCT/ISA/210 for International Application No. PCT/CA2014/050655 dated Oct. 14, 2014.

* cited by examiner

*Primary Examiner* — Hieu Nguyen
(74) *Attorney, Agent, or Firm* — Harness, Dickey & Pierce

(57) ABSTRACT

An amplifying structure includes a main amplifier configured to amplify a first signal; and a peak amplifier configured to amplify a second signal, each of the main amplifier and the peak amplifier including, respectively, a hybrid power device, the hybrid power device including, a first power transistor die configured to amplify signals of a first frequency, and a second power transistor die configured to amplify signals of a second frequency different than the first frequency.

20 Claims, 5 Drawing Sheets

DUAL-BAND HIGH EFFICIENCY DOHERTY AMPLIFIERS WITH HYBRID PACKAGED POWER DEVICES

BACKGROUND

Wireless Communication Standards are changing rapidly in order to respond to the never decreasing thirst of the consumers who continuously seek the ability to exchange of high data volume at higher data rate, and at lower cost. Network operators may find it challenging to handle the cost associated with continuously trying to adapt their already deployed sites with the new standards in order to satisfy the desires of the consumers. Base station vendors face similar challenges as their wireless product strategy is affected by the continuous standard changes. Multi-standard and multi-band radio Base Station represent one solution that may reduce the cost of these products as well as the cost of the future wireless network infrastructures. The software defined radio appears to be the leading technology that will drive the future multi-standard base stations. Another enabling component for these converged products is the Multi-band transceiver. More specifically, a power amplifier included a Multi-band transceiver may be required to operate in a multitude of frequency bands. In addition, in order to keep the base station operating expenses (OPEX) low, the broadband/multiband Power Amplifiers should be highly efficient. This requirement for high efficiency represents another challenge for network operators and base station vendors.

SUMMARY

According to at least one example embodiment, an amplifying structure includes a main amplifier configured to amplify a first signal; and a peak amplifier configured to amplify a second signal, each of the main amplifier and the peak amplifier including, respectively, a hybrid power device, each of the hybrid power devices including, respectively, a first power transistor die configured to amplify signals of a first frequency, and a second power transistor die configured to amplify signals of a second frequency different than the first frequency.

The amplifying structure may be a Doherty amplifier.

Sizes of the first and second power transistor dies of the main amplifier may be the same as sizes of the first and second power transistor dies of the peak amplifier, respectively.

Sizes of the first and second power transistor dies of the main amplifier may be smaller than sizes of the first and second power transistor dies of the peak amplifier, respectively.

The first and second power transistor dies of the main amplifier and the first and second power transistor dies of the peak amplifier may each include a laterally diffused metal oxide semiconductor (LDMOS) structure.

The first and second power transistor dies of the main amplifier and the first and second power transistor dies of the peak amplifier may each include a Gallium Nitride (GaN) structure.

The first and second power transistor dies of the main amplifier and the first and second power transistor dies of the peak amplifier may each include one or more high heterojunction bipolar transistors (HBT).

The first and second power transistor dies of the main amplifier and the first and second power transistor dies of the peak amplifier may each include one or more pseudomorphic heterojunction pHEMT power transistors.

The second frequency may be higher than the first frequency, the first power transistor dies of the main amplifier and the peak amplifier may each include a laterally diffused metal oxide semiconductor (LDMOS) structure, and the second power transistor dies of the main amplifier and the peak amplifier may each include a Gallium Nitride (GaN) structure.

A difference between the first frequency and the second frequency may be in between 200 MHz and 1000 MHz.

A difference between the first frequency and the second frequency may be more than 1000 MHz.

The hybrid power device of the main amplifier may include a first input internal matching network configured to operate at the first frequency, where the first input internal matching network includes a first capacitor and being configured to transform an input impedance of the first power transistor die of the hybrid device of the main amplifier, and the hybrid power device of the main amplifier may include a second input internal matching network configured to operate at the second frequency, where the second input internal matching network includes a second capacitor and being configured to transform an input impedance of the second power transistor die of the hybrid device of the main amplifier.

The first input internal matching network may include a first plurality of inner bonding wires connecting the first capacitor to the first power transistor die of the hybrid device of the main amplifier and a first plurality of outer bonding wires connecting the first capacitor to a first gate lead, and the second input internal matching network may include a second plurality of inner bonding wires connecting the second capacitor to the second power transistor die of the hybrid device of the main amplifier and a second plurality of outer bonding wires connecting the second capacitor to a second gate lead.

The hybrid power device of the main amplifier may include a first output internal matching network configured to operate at the first frequency, where the first output internal matching network includes a first capacitor and being configured to transform an output impedance of the first power transistor die of the hybrid device of the main amplifier, and the hybrid power device of the main amplifier may include a second output internal matching network configured to operate at the second frequency, where the second output internal matching network includes a second capacitor and being configured to transform an output impedance of the second power transistor die of the hybrid device of the main amplifier.

The first output internal matching network may include a first plurality of inner bonding wires connecting the first capacitor to the first power transistor die of the hybrid device of the main amplifier and a first plurality of outer bonding wires connecting the first capacitor to a first drain lead, and the second output internal matching network may include a second plurality of inner bonding wires connecting the second capacitor to the second power transistor die of the hybrid device of the main amplifier and a second plurality of outer bonding wires connecting the second capacitor to a second drain lead.

The hybrid power device of the peak amplifier may include a first input internal matching network configured to operate at the first frequency, where the first input internal matching network includes a first capacitor and being configured to transform an input impedance of the first power transistor die of the hybrid device of the peak amplifier, and the hybrid power device of the peak amplifier may include a second input internal matching network configured to operate at the second frequency, where the second input internal matching network includes a second capacitor and being configured to transform an input impedance of the second power transistor die of the hybrid device of the peak amplifier.

The first input internal matching network may include a first plurality of inner bonding wires connecting the first capacitor to the first power transistor die of the hybrid device of the peak amplifier and a first plurality of outer bonding wires connecting the first capacitor to a first gate lead, and the second input internal matching network may include a second plurality of inner bonding wires connecting the second capacitor to the second power transistor die of the hybrid device of the peak amplifier and a second plurality of outer bonding wires connecting the second capacitor to a second gate lead.

The hybrid power device of the peak amplifier may include a first output internal matching network configured to operate at the first frequency, where the first output internal matching network includes a first capacitor and being configured to transform an output impedance of the first power transistor die of the hybrid device of the peak amplifier, and the hybrid power device of the peak amplifier may include a second output internal matching network configured to operate at the second frequency, where the second output internal matching network includes a second capacitor and being configured to transform an output impedance of the second power transistor die of the hybrid device of the peak amplifier.

The first output internal matching network may include a first plurality of inner bonding wires connecting the first capacitor to the first power transistor die of the hybrid device of the peak amplifier and a first plurality of outer bonding wires connecting the first capacitor to a first drain lead, and the second output internal matching network may include a second plurality of inner bonding wires connecting the second capacitor to the second power transistor die of the hybrid device of the peak amplifier and a second plurality of outer bonding wires connecting the second capacitor to a second drain lead.

One or more of the hybrid device of the main amplifier and the hybrid device of the peak amplifier may include one or more low-temperature co-fired creaming (LTCC) integrated circuits for implementing integrated input and output matching networks with both or either of the main and the peak hybrid power devices.

BRIEF DESCRIPTION OF THE DRAWINGS

Example embodiments will become more fully understood from the detailed description given herein below and the accompanying drawings, wherein like elements are represented by like reference numerals, which are given by way of illustration only and thus are not limiting of the present invention, and wherein.

DETAILED DESCRIPTION OF EXAMPLE EMBODIMENTS

Figure 1A:
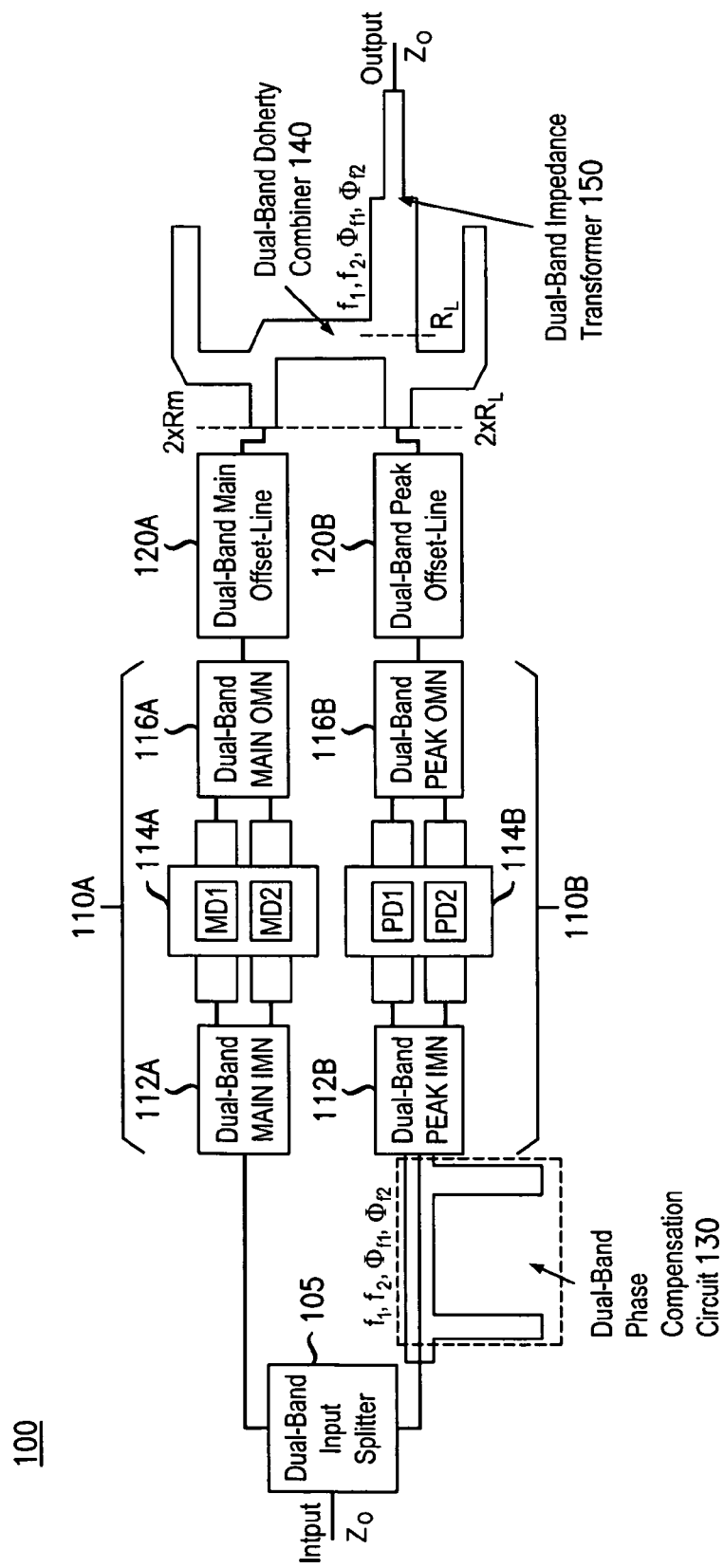
FIG. 1A illustrates a Doherty amplifier structure according to at least one example embodiment.

Various example embodiments will now be described more fully with reference to the accompanying drawings. Like elements on the drawings are labeled by like reference numerals.

As used herein, the singular forms "a", "an", and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiment will now be described with reference to the attached figures. Various structures, systems and devices are schematically depicted in the drawings for purposes of explanation only and so as not to obscure the present invention with details that are well known to those skilled in the art. Nevertheless, the attached drawings are included to describe and explain example embodiments. The words and phrases used herein should be understood and interpreted to have a meaning consistent with the understanding of those words and phrases by those skilled in the relevant art. To the extent that a term or phrase is intended to have a special meaning, i.e., a meaning other than that understood by skilled artisans, such a special definition will be expressly set forth in the specification that directly and unequivocally provides the special definition for the term or phrase.

Embodiments of the present invention overcome deficiencies of the conventional Doherty amplifiers when used in multi-band applications by providing a hybrid packaged power device. The hybrid packaged power devices according to example embodiments are configured to perform amplification over two different frequencies, which may be substantially separated from one another, while still allowing the Doherty amplifier to exhibit Doherty behavior. As will be discussed in greater detail below, both the main and peak power amplifiers of a Doherty amplifier may be implemented by the hybrid packaged power devices according to example embodiments.

The Doherty amplifiers of the present invention may be embodied in a base station in a wireless communication system that provides wireless connectivity to a number of end uses. The Doherty amplifiers may amplify signals to be transmitted to the end uses. Further, the Doherty amplifiers of the present invention may be embodied in other types of devices such as W-CDMA, UMTS, LTE or WiMAX base stations, base transceiver stations, base station routers, WiFi access points, or any other device that provides the radio baseband functions for data and/or voice connectivity between a network and one or more end users. The end users may include but are not limited to end user (EU) equipment, fixed or mobile subscriber units, receivers, cellular telephones, personal digital assistants (PDA), personal computers, or any other type of user device capable of operating in a wireless environment.

A Doherty amplifier according to example embodiments is a multi-band power amplifier including a hybrid package power device capable of operating with respect to at least two different frequencies, simultaneously. These embodiments are discussed with reference to FIGS. 1-4 of the present application.

FIG. 1A illustrates a structure of a Doherty amplifier 100 according to at least one example embodiment.

The Doherty amplifier 100 includes a dual-band input splitter 105 configured to split an input signal into a first signal and a second signal, a main amplifier 110A for amplifying the first signal, a peak amplifier 110B for selectively amplifying the second signal, a dual-band phase compensator 130 for shifting a phase of the second signal, a dual-band Doherty combiner 140 for combining the output of the main amplifier 110A and the peak amplifier 110B, and a dual-band impedance transformer 150 configured to perform the impedance transformation of the combining node load $R_L$ impedance to output load impedance of the Doherty $Z_0$.

The dual-band input splitter 105 generally divides the input signal into first and second signals and is capable of operating at two different frequencies. The dual-band input splitter 105 may have the structure of any known dual-band Doherty power splitter.

The dual-band input splitter 105 may receive an input signal. The dual-band input splitter 105 may provide the first signal through a connection to an input of the main amplifier 110A, and provide the second signal though a connection to an input of the peak amplifier 110B via the phase compensator 130.

The phase compensator 130 is connected between the dual band input splitter 105 and the input of the peak amplifier 110B. The phase compensator 130 is configured to compensate for the phase change introduced by the dual-band Doherty combiner 140. The phase compensator 130 may be based, for example, on a three transmission line arrangement in a "pi" structure as is illustrated in FIG. 1A. Though FIG. 1A illustrates an example in which the phase compensator 130 may have the "pi" structure, the dual-band phase compensator 130 may have the structure of any known dual-band Doherty phase compensator.

Figure 1B:
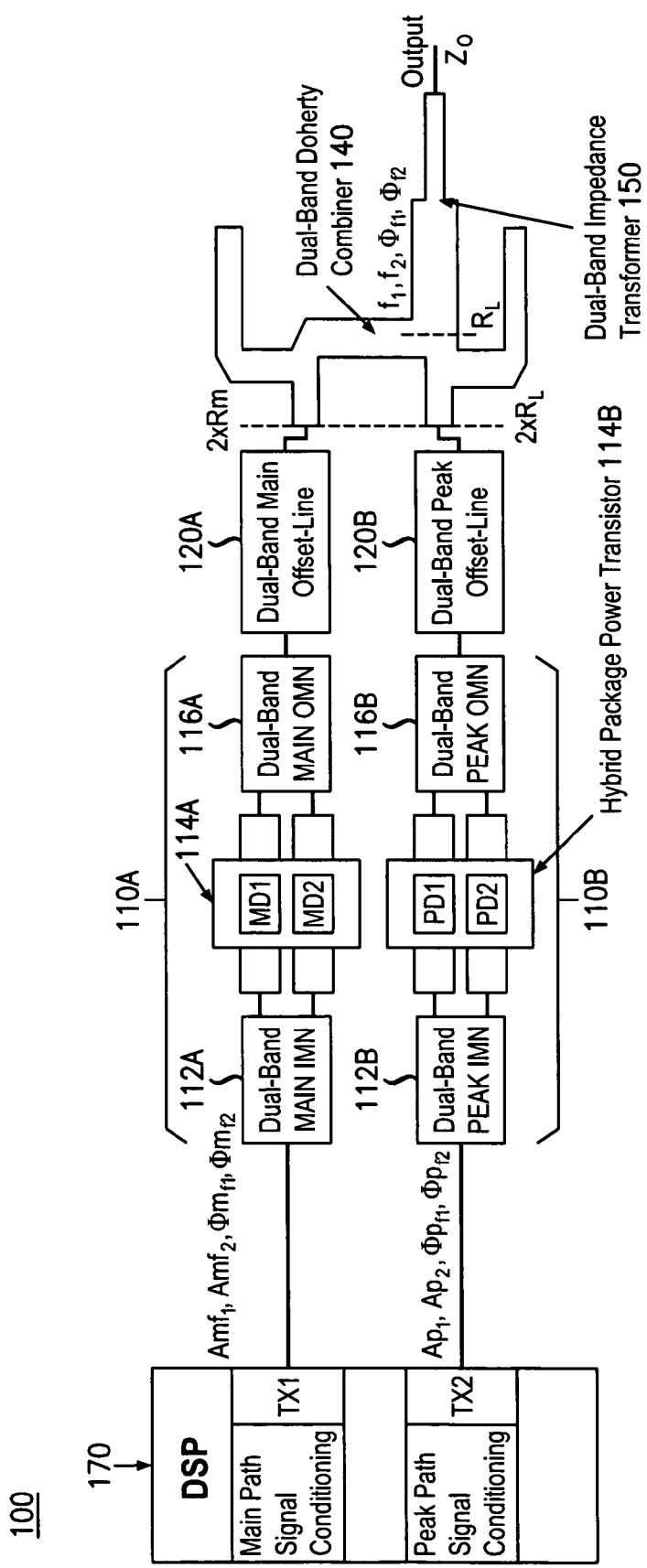
FIG. 1B illustrated a Doherty amplifier structure including a digital signal processor (DSP) according to at least one example embodiment.

Further, in embodiments where dual-band digital Doherty is used, the phase compensator 130 may be omitted. For example, FIG. 1B shows the Doherty amplifier 100 including a digital signal processor (DSP) 170 for implementing dual-band digital Doherty. As is illustrated in FIG. 1B, when the DSP 170 is used, the phase compensator 130 may be omitted.

After the input signal is split into the first and second signals and the second signal passes through the phase compensator 130, the first and second signals are then amplified, respectively, by the main amplifier 110A, or the combination of the main amplifier 110A and the peak amplifier 110B, as discussed below.

For instance, the peak amplifier 110B is selectively operable to operate at selected times in combination with the main amplifier 110A. That is, the peak amplifier 110B may be kept off until power requirements call for a higher power output from the whole Doherty power amplifier 100, at which time the peak amplifier 110B is turned on and operates to contribute to the output power increase of the Doherty power amplifier 100. In other words, the peak amplifier 110B amplifies the second signal at higher peak envelopes where the signal strength of the second signal is above a threshold level. The term "selectively operable" indicates the amplifier operational state changes in response to the input signal. Otherwise, if the signal strength of the second signal is below the threshold level, the peak amplifier 110B is turned OFF and only the main amplifier 110A operates to amplify the first signal.

The main amplifier 110A includes a dual band main input matching network (IMN) 112A, a main hybrid packaged power device 114A and a dual band main output matching network (OMN) 116A. Signals are input to the main amplifier 110A through the dual band main input matching network (IMN) 112A, and output from the main amplifier 110A through the output matching network (OMN) 116A. As will be discussed in greater detail below, the main hybrid packaged power device 114A includes two dies, a first main die MD1 and a second main die MD2. The first and second main dies MD1 and MD2 include power transistors configured to operate at different frequencies, respectively. A first output of the dual-band main IMN 112A is connected to an input of the first main die MD1, and an output of the first main die MD1 is connected to a first input of the dual-band main OMN 116A. A second output of the dual-band main IMN 112A is connected to an input of the second main die MD2, and an output of the second main die MD2 is connected to a second input of the dual-band main OMN 116A. The dual-band main input matching network IMN 112A transforms the 2 complex input impedances $Z_{im1}=a_{im1}\pm jb_{im1}$ and $Z_{im2}=a_{im2}\pm jb_{im2}$ presented by the dies MD1 and MD2, respectively, to an intermediate real impedance $R_0$. The real impedance $R_0$ can be 50Ω or any intermediary value that eases the design of the dual-band matching network IMN 112A. The dual band main OMN 116A transforms the 2 complex output impedances $Z_{om1}=a_{om1}\pm jb_{om1}$ and $Z_{om2}=a_{om2}\pm jb_{om2}$ presented by the dies MD1 and MD2, respectively, to a real impedance $2\times R_m$ at power back-off (peak stage is off) and to a real impedance $R_m$ at peak power (peak running at full power). The real impedance $R_m$ can be 50Ω or any intermediary value that ease the design of the Dual-band output matching network OMN 116A.

As used herein, a variable using the format 'Zx' denotes an impedance x, 'ax' denotes a resistance component of a corresponding impedance Zx, 'bx' denotes a reactance component of a corresponding impedance Zx, and 'j' is the imaginary unit.

In another embodiment, the main dies MD1 and MD2 use integrated circuit technology including, for example, low-temperature co-fired ceramic (LTCC) or other similar technologies to allow highly integrated matching networks topologies that allow the design of internal matching circuitry that provide real input and output device impedances. In this case, the dual-band main input matching network IMN 112A transforms the 2 real input impedances $R_{im1}$ and $R_{im2}$ presented by the dies MD1 and MD2, respectively, to an intermediate real impedance $R_0$. The real impedance $R_0$ can be, for example, 50Ω or any intermediary value that eases the design of the Dual-band matching network IMN 112A. The dual band OMN 116A transforms the 2 real output impedances $R_{om1}$ and $R_{om2}$ presented by the dies MD1 and MD2, respectively, to a real impedance $2\times R_m$ at power back-off (peak stage is off) and to a real impedance $R_m$ at peak power (peak running at full power). The real impedance $R_m$ can be, for example, 50Ω or any intermediary value that ease the design of the Dual-band output matching network OMN 116A.

The peak amplifier 110B includes a structure similar to that discussed above with respect to the main amplifier 110A. The peak amplifier 110B includes a dual band peak input matching network (IMN) 112B, a peak hybrid packaged power device 114B and a dual band main output matching network (OMN) 116B. Signals are input to the peak amplifier 110B through the dual band peak input matching network (IMN) 112B, and output from the peak amplifier 110B through the output matching network (OMN) 116B. As will be discussed in greater detail below, the peak hybrid packaged power device 114B includes two dies, a first peak die PD1 and a second peak die PD2. The first and second peak dies PD1 and PD2 include power transistors configured to operate at different frequencies, respectively. A first output of the dual-band peak IMN 112B is connected to an input of the first peak die PD1, and an output of the first peak die PD1 is connected to a first input of the dual-band peak OMN 116B. A second output of the dual-band peak IMN 112B is connected to an input of the second peak die PD2, and an output of the second peak die PD2 is connected to a second input of the dual-band peak OMN 116B. The dual-band peak IMN 112B transforms the 2 complex input impedances $Z_{ip1}=a_{ip1}\pm jb_{ip1}$ and $Z_{ip2}=a_{ip2}\pm jb_{ip2}$ presented by the dies PD1 and PD2, respectively, to an intermediate real impedance $R_0$. The real impedance $R_0$ can be, for example, 50Ω or any intermediary value that eases the design of the Dual-band matching network IMN 112B. The dual band peak OMN 116B transforms the 2 complex output impedances $Z_{op1}=a_{op1}\pm jb_{op1}$ and $Z_{op2}=a_{op2}\pm jb_{op2}$ presented by the dies PD1 and PD2, respectively, to an intermediate real impedance $R_0$. The real impedance $R_0$ can be, for example, 50Ω or any intermediary value that ease the design of the Dual-band matching network OMN 116B.

In another embodiment, the peak dies PD1 and PD2 uses integrated circuit technology like LTCC or other similar technologies to allow highly integrated matching network topologies that allow the design of internal matching circuitry that provide real input and output device impedances. In this case, the dual-band peak input matching network IMN 112B transforms the 2 real input impedances $R_{ip1}$ and $R_{ip2}$ presented by the dies PD1 and PD2, respectively, to an intermediate real impedance $R_0$. The real impedance $R_0$ can be, for example, 50Ω or any intermediary value that eases the design of the dual-band matching network IMN 112B. The dual band peak OMN 116B transforms the 2 real output impedances $R_{op1}$ and $R_{op2}$ presented by the dies PD1 and PD2, respectively, to an intermediate real impedance $R_0$. The real impedance $R_0$ can be, for example, 50Ω or any intermediary value that ease the design of the Dual-band matching network OMN 116B.

The outputs of the main amplifier 110A and the peak amplifier 110B are respectively connected to the dual-band main offset line 120A and the dual-band peak offset line 120B. The dual-band main offset line 120A receives the first signal and the dual-band peak offset line 120B receives the second signal.

The purpose of the dual-band main offset line 120A is to ensure that the main stage load impedance at power back-off $2\times R_m$ is located in a high or peak efficiency area on the load pull contours. Hence, high or maximum efficiency is achieved at power back-off. As this condition should be verified at the dual-band frequencies, the dual-band offset line structure can be designed using structures and techniques known in the domain, including for example a T-structure line designed to include the electrical lengths l1 and l2 needed to ensure a maximum or, alternatively, desirable efficiency match, at power back-off, at both frequencies f1 and f2 can be used.

The purpose of the dual-band peak offset line 120B is to provide an open circuit at the Doherty output combining node, when the peak stage is OFF. As the open circuit needs to be provided at the dual-frequency bands of operation, a dual-band offset line circuit is desirable. The dual-band offset line circuit can be designed using structures and techniques known in the domain, including for example a T-structure line designed to include the electrical lengths l1 and l2 needed to ensure desirable open circuits, at power back-off, at both f1 and f2 can be used.

In accordance with the known Doherty operating principle, the output impedance of the main amplifier 110A is a modulated impedance, $R_m$, which is modulated as a result of the variation of the current of the peak amplifier 110B in conjunction with the dual-band Doherty combiner 140. The dual-band Doherty combiner 140 receives the first signal from the dual-band main offset line 120A, and receives the second signal from the dual-band peak offset line 120B. The dual-band Doherty combiner 140 serves as an impedance inverter and, in accordance with known methods, is configured to act as a dual-band impedance inverter that that ensures an impedance transformations that include −90 degrees phase shifts at the dual-band frequencies f1 and f2 at which the dual-band Doherty amplifier 100 is configured to operate. In the example illustrated in FIG. 1A, the dual-band Doherty combiner is implemented using the known microstrip line "pi" structure. However, according to at least some embodiments, other known structures for impedance inverters capable of handling multiple frequencies can be used to implement the dual-band Doherty combiner 140, as well.

The dual-band Doherty combiner 140 is connected to an output of the dual-band Doherty amplifier 100 via the dual-band impedance transformer 150. In accordance with known methods, the dual-band impedance transformer is configured to transform the output load $Z_0$ of the dual-band Doherty amplifier 100 to the combining node load $R_L$ at the output of the dual-band Doherty combiner 140.

As is discussed above, in the dual-band Doherty amplifier 100, each of the main amplifier 110A and the peak amplifier 110B include a hybrid packaged power device 114A and 114B. The hybrid packaged power device 114A of the main amplifier 110A includes two separate dies MD1 and MD2 respectively configured and designed for two different frequencies f1 and f2. Likewise, the hybrid packaged power device 114B of the peak amplifier 110B includes two separate dies PD1 and PD2 also respectively configured and designed for the two different frequencies f1 and f2.

By using a hybrid package including two dies optimized or, alternatively, designed for two different frequencies f1 and f2 for implementing both the main and peak amplifiers 110A and 110B of the Doherty amplifier 100, the Doherty amplifier is capable of achieving high levels of performance, for example in terms of efficiency, over the two different frequencies f1 and f2 which may be significantly far apart from one another.

In comparison, some broadband technologies like Gallium Nitride (GaN) may use a single die power transistor to implement a dual-band Doherty amplifier. However, because the Doherty power amplifier is inherently narrow band, using GaN power transistors will not allow for high performance over the two frequency bands f1 and f2 of operation, mainly, when the these two frequencies are far apart. In fact, although GaN power transistors are broadband at saturated power operation, the load contour variation over frequency generally presents a narrow band characteristic, at power-back-off (on the 2:1 constant voltage standing wave ratio (VSWR) circle). Hence the resulting GaN based Doherty amplifier may not be capable of achieving high levels of efficiency over multiple frequencies, mainly, when the frequencies are significantly separated from one another, for example a first frequency of 700 MHz and a second frequency of 2100 MHz or 2600 MHz. Further, GaN power transistors are expensive. Additionally, less expensive alternative power transistor technologies, like laterally diffused metal oxide semiconductor (LDMOS), have bandwidths which are generally even more narrow that GaN power transistors, and thus, are generally less capable than GaN technology of use in dual-band Doherty amplifiers.

To the contrary, the hybrid packaged power devices used in a Doherty amplifier according to example embodiments use separate dies, each of which includes a power transistor designed or, for example, optimized for a different frequency (e.g., two dies designed for frequencies f1 and f2, respectively). The use of multiple dies designed, respectively, for different frequencies allows a Doherty amplifier according to example embodiments to operate at high or maximum performance for multiple frequencies which are significantly separated from one another using, for example, low cost LDMOS power transistors. Consequently, the hybrid packaged power devices used in the dual-band Doherty amplifier 100 allow the Doherty amplifier to operate at higher overall efficiency while also maintaining lower production costs when compared to conventional GaN dual-band Doherty amplifiers. Additionally, in accordance with at least one example embodiment, hybrid packaged power devices used in the Doherty amplifier 100 may also include other types of dies, for example GaN dies, instead of, or in addition to, LDMOS dies.

For example, types of transistors the hybrid packaged power devices according to example embodiments may include one or more of GaN power transistors, High Heterojunction Bipolar Transistors (HBT), Galium Arsenide power transistors (GaAs), and pseudomorphic heterojunction pHEMT power transistors.

The structures of the hybrid packaged power devices 114A and 114B will now be discussed in greater detail below with reference to FIGS. 2-4.

Figure 2:
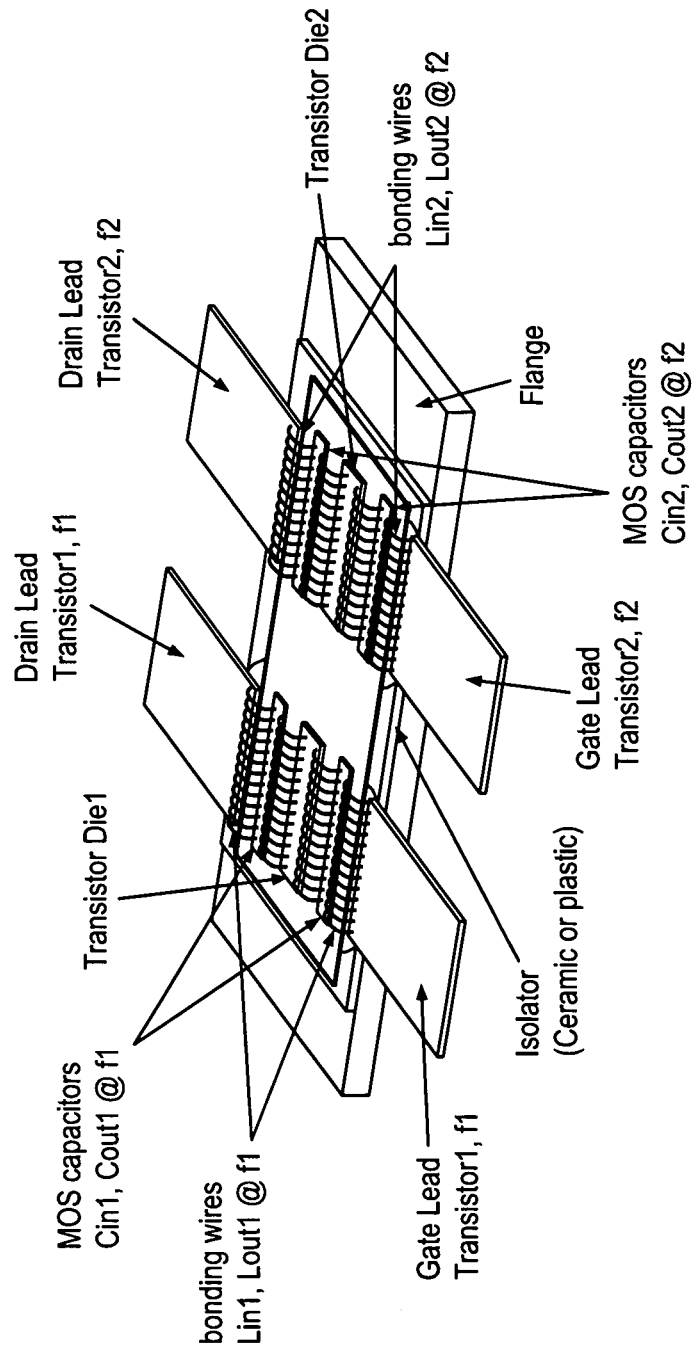
FIG. 2 illustrates a hybrid packaged power device structure of a Doherty amplifier according to at least one example embodiment.

FIG. 2 illustrates a hybrid packaged power device 200 in accordance with at least one example embodiment. As is illustrated in FIG. 2, the hybrid packaged power device 200 includes a first transistor die, die1, and a second transistor die, die2 which are designed to operate at two frequencies f1 and f2, respectively. FIG. 3 illustrates a circuit diagram of a portion of hybrid packaged power device 200 that corresponds to the first transistor die, die 1. FIG. 4 illustrates a circuit diagram of a portion of hybrid packaged power device 200 that corresponds to the second transistor die, die 2.

One or both of the main and peak hybrid packaged power devices 114A and 114B may have the same structure and operation as the hybrid power packaged device 200. For example, when the hybrid power packaged device 200 implements the main hybrid packaged power device 114A, the first transistor die die1 illustrated in FIG. 2 may implement the first main die MD1 and the second transistor die die2 illustrated in FIG. 2 may implement the second main die MD2 illustrated in FIG. 1. Similarly, when the hybrid power packaged device 200 implements the peak hybrid packaged power device 114B, the first transistor die die1 illustrated in FIG. 2 may implement the first peak die PD1 and the second transistor die die2 illustrated in FIG. 2 may implement the second peak die PD2 illustrated in FIG. 1.

Each of the transistor dies die 1 and die2 is connected to an input internal matching network and an output internal matching network. The respective input internal matching networks of transistor dies die 1 and die2 transform the low input impedances of transistor dies die 1 and die2 to levels that are more desirable for a power amplifier designer. Moreover, the input internal matching networks of die 1 is designed or, for example, optimized for high or maximum performance at frequency f1 while the input matching network of die2 is designed or, for example, optimized for high or maximum performance at frequency f2. Similarly, the respective output internal matching networks of transistor dies die 1 and die2 transform the low output impedances of transistor dies die1 and die2 to levels that are more desirable for a power amplifier designer. Moreover, the output internal matching networks of die1 is designed or, for example, optimized for high or maximum performance at frequency f1 while the output matching network of die2 is designed or, for example, optimized for high or maximum performance at frequency f2.

The input and output internal matching networks of transistor dies die1 and die2 will now be discussed in greater detail below with reference to FIGS.

Figure 3:
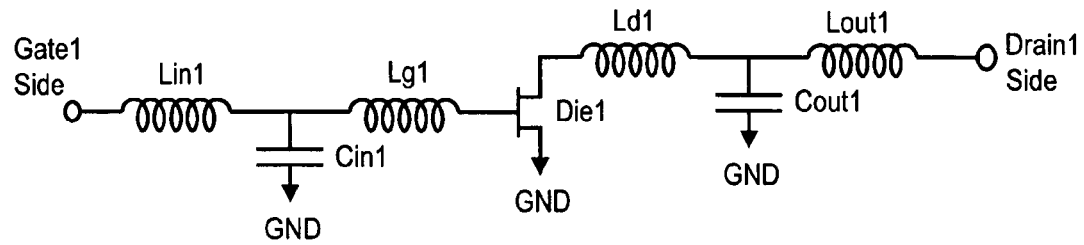
FIG. 3 illustrates a circuit diagram of a portion of the hybrid packaged power device of FIG. 2 that corresponds to a first transistor die.
Figure 4:
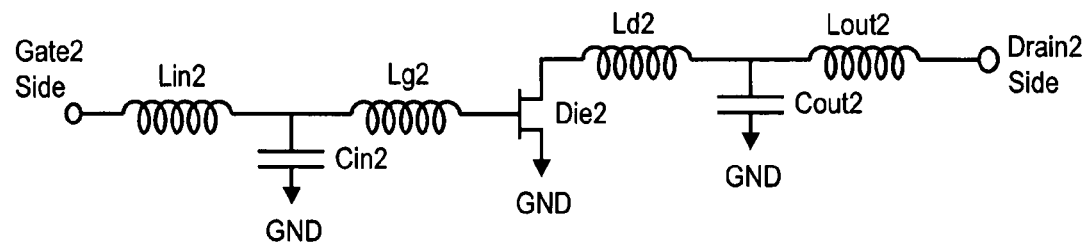
FIG. 4 illustrates a circuit diagram of a portion of the hybrid packaged power device of FIG. 2 that corresponds to a second transistor die.

As is illustrated in FIGS. 2-4, the input and output internal matching networks of transistor dies die1 and die2 include an array of small diameter bonding wires and shunt metal oxide silicon (MOS) capacitors.

In the example illustrated in FIGS. 2 and 3, the input internal matching network of the first transistor die die1 includes first inner input bonding wires Lg1 connecting die1 to a first input shunt capacitor Cin1 which is connected to a first gate lead Gate1 via first outer input bonding wires Lin1; and the output internal matching network of the first transistor die die1 includes first inner output bonding wires Ld1 connecting die1 to a first output shunt capacitor Cout1 which is connected to a first drain lead Drain1 via first outer output bonding wires Lout1.

Similarly, in the example illustrated in FIGS. 2 and 4, the input internal matching network of the second transistor die die2 includes second inner input bonding wires Lg2 connecting die2 to a second input shunt capacitor Cin2 which is connected to a second gate lead Gate2 via second outer input bonding wires Lin2; and the output internal matching network of the second transistor die die2 includes second inner output bonding wires Ld2 connecting die2 to a second output shunt capacitor Cout2 which is connected to a second drain lead Drain2 via second outer output bonding wires Lout2.

As is discussed above, transistor dies die1 and die2 may be designed to operate at two different frequencies f1 and f2, respectively. In accordance with known techniques, the input and output internal matching networks of first transistor die die1 (e.g., one or more of first capacitors Cin1, Cout1, and first bonding wires Lin1, Lg1, Ld1 and Lout1) may be designed in order to achieve optimal, or alternatively, desirable performance for a first frequency f1. Similarly, the input and output internal matching networks of second transistor die die2 (e.g., one or more of second capacitors Cin2, Cout2, and second bonding wires Lin2, Lg2, Ld2 and Lout2) may be designed in order to achieve optimal, or alternatively, desirable performance for a second frequency f2.

According to some example embodiments, for large transistor devices, the internal matching networks can include up to 100 or 200 or more bonding wires and several MOS capacitors densely packaged into a package cavity of the hybrid packaged power device 200. A package type of the hybrid packaged power device 200 may be, for example, ceramic type or plastic type. For high power radio frequency (RF) integrated circuit (IC) product implementations, the internal matching networks of the hybrid packaged power device 200 may be based on, for example, one or more of on-chip spiral inductors, capacitors and transmission lines. The internal matching networks of the hybrid packaged power device 200 may introduce very high-Q resonances that allow an impedance transformation function.

Asymmetric dies can be used in the hybrid packaged power device 200. The asymmetry used can be reflected by one or more of the size of the dies and to the technology used to design the dies.

Figure 5:
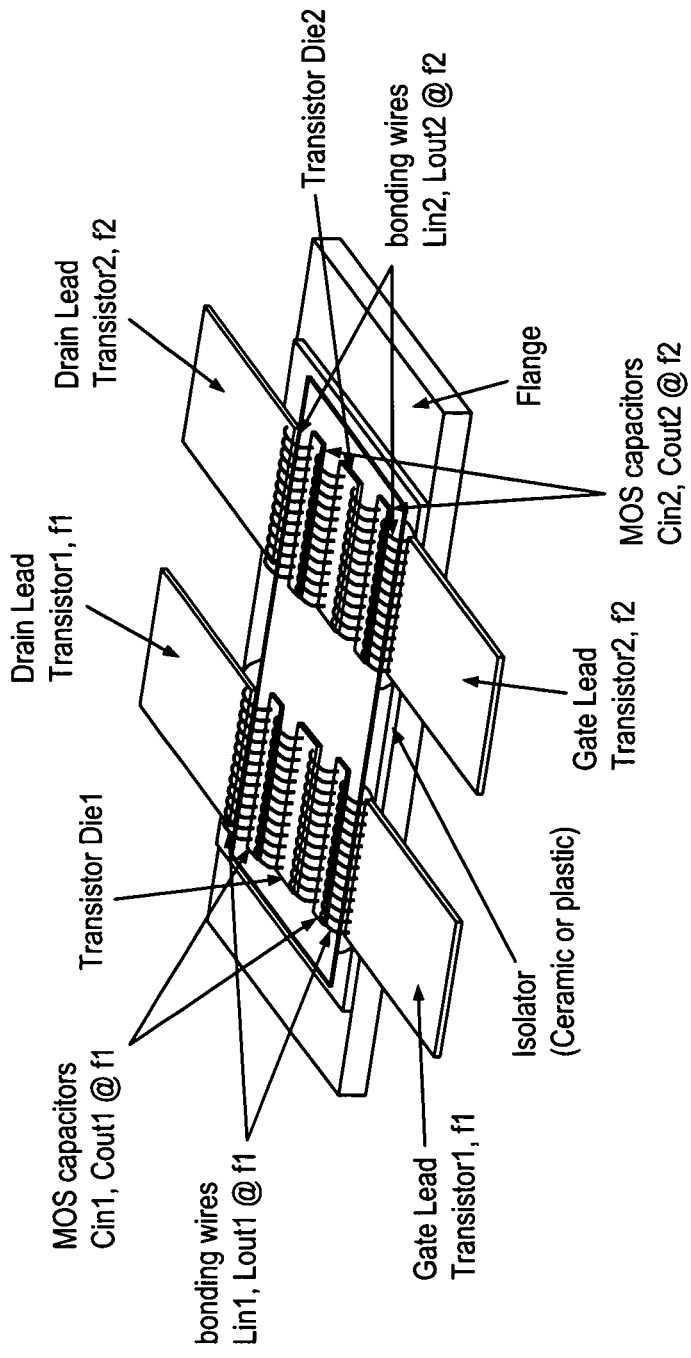
FIG. 5 illustrates a hybrid packaged power device which includes asymmetric dies.

In the case of asymmetric versions of main and peak hybrid packaged devices 114A and 114B, the first main die MD1 operating at f1 and the second main die MD2 die operating at f2 can have half of the size of the first peak die PD1 operating at f1 and the second peak die PD2 operating at f2. The difference in size is directly related to the peak to average ratio (PAR) of the signal that is being amplified, which may vary based on the product or application for which the signal is being used. Hence, for a PAR of 8-9 dB, it may be preferable for the peak efficiency to occur at 8-9 dB back-off from peak power. Thus, it may be desirable for the sizes of first and second peak dies PD1 and PD2 to be double the sizes of first and second main dies MD1 and MD2. For example, FIG. 5 illustrates a hybrid packaged power device 500 which includes asymmetric dies. The hybrid packaged power device 500 is the same as the hybrid packaged power device 200 with the exception that the second transistor die die2 is larger than the first transistor die die1. In the same manner discussed above with reference to hybrid packaged power device 200, one or both of the main and peak hybrid packaged power devices 114A and 114B may have the same structure and operation as the hybrid power packaged device 500.

In another embodiment, the asymmetry in the dies within the main hybrid packaged device 114A can be reflected in the difference of the technology used for the MD1 die operating at f1 and the MD2 die operating at f2. As example, MD1 die operating at f1 can be designed using LDMOS technology while MD2 die operating at f2 can use GaN technology. This technology asymmetry can allow the use of low cost technology (LDMOS) at low frequency of f1 where LDMOS excels and have similar performance, in efficiency, than high cost technology like GaN which provide better performance at higher frequency f2 where LDMOS cannot compete.

In another embodiment, the asymmetry in the dies within the peak hybrid packaged device 114B can be reflected in the difference of the technology used for the PD1 die operating at f1 and the PD2 die operating at f2. As an example, PD1 die operating at f1 can be designed using LDMOS technology while PD2 die operating at f2 can use GaN technology. This technology asymmetry can allow the use of low cost LDMOS technology at the low frequency of f1 where LDMOS excels and has performance similar to that of GaN technology in terms efficiency, while also allowing the use of high cost technology like GaN at the higher f2 frequency where GaN technology excels and LDMOS technology may, under some circumstances, show some limitations.

The asymmetry described above can be applied for both the main and peak hybrid packaged power devices 114A and 114B, simultaneously, or only for the main hybrid package device 114A, or only for the peak hybrid package device 114B.

All the power transistor technologies mentioned above (LDMOS, GaN, GaAs FET, HBT, pHEMT) can use the hybrid package device dies and can follow the different configurations and asymmetries described above.

Variations of the example embodiments of the present invention are not to be regarded as a departure from the spirit and scope of the example embodiments of the invention, and all such variations as would be apparent to one skilled in the art are intended to be included within the scope of this invention.

What is claimed:

1. An amplifying structure, comprising:
    a main amplifier configured to amplify a first signal; and
    a peak amplifier configured to amplify a second signal,
    each of the main amplifier and the peak amplifier including, respectively, a hybrid power device, each of the hybrid power devices including, respectively,
        a first power transistor die configured to amplify signals of a first frequency, and
        a second power transistor die configured to amplify signals of a second frequency different than the first frequency.

2. The amplifying structure of claim 1, wherein the amplifying structure is a Doherty amplifier.

3. The amplifying structure of claim 1, wherein sizes of the first and second power transistor dies of the main amplifier are the same as sizes of the first and second power transistor dies of the peak amplifier, respectively.

4. The amplifying structure of claim 1, wherein sizes of the first and second power transistor dies of the main amplifier are smaller than sizes of the first and second power transistor dies of the peak amplifier, respectively.

5. The amplifying structure of claim 1, wherein the first and second power transistor dies of the main amplifier and the first and second power transistor dies of the peak amplifier each include a laterally diffused metal oxide semiconductor (LDMOS) structure.

6. The amplifying structure of claim 1, wherein the first and second power transistor dies of the main amplifier and the first and second power transistor dies of the peak amplifier each include a Gallium Nitride (GaN) structure.

7. The amplifying structure of claim 1, wherein the first and second power transistor dies of the main amplifier and the first and second power transistor dies of the peak amplifier each include one or more high heterojunction bipolar transistors (HBT).

8. The amplifying structure of claim 1, wherein the first and second power transistor dies of the main amplifier and the first and second power transistor dies of the peak amplifier each include one or more pseudomorphic heterojunction pHEMT power transistors.

9. The amplifying structure of claim 1, wherein the second frequency is higher than the first frequency, the first power transistor dies of the main amplifier and the peak amplifier each include a laterally diffused metal oxide semiconductor (LDMOS) structure, and the second power transistor dies of the main amplifier and the peak amplifier each include a Gallium Nitride (GaN) structure.

10. The amplifying structure of claim 1, wherein a difference between the first frequency and the second frequency is in between 200 MHz and 1000 MHz.

11. The amplifying structure of claim 1, wherein a difference between the first frequency and the second frequency is more than 1000 MHz.

12. The amplifying structure of claim 1 wherein,
    the hybrid power device of the main amplifier includes a first input internal matching network configured to operate at the first frequency, the first input internal matching network including a first capacitor and being configured to transform an input impedance of the first power transistor die of the hybrid device of the main amplifier, and
    the hybrid power device of the main amplifier includes a second input internal matching network configured to operate at the second frequency, the second input internal matching network including a second capacitor and being configured to transform an input impedance of the second power transistor die of the hybrid device of the main amplifier.

13. The amplifying structure of claim 12 wherein,
the first input internal matching network includes a first plurality of inner bonding wires connecting the first capacitor to the first power transistor die of the hybrid device of the main amplifier and a first plurality of outer bonding wires connecting the first capacitor to a first gate lead, and
the second input internal matching network includes a second plurality of inner bonding wires connecting the second capacitor to the second power transistor die of the hybrid device of the main amplifier and a second plurality of outer bonding wires connecting the second capacitor to a second gate lead.

14. The amplifying structure of claim 1 wherein,
the hybrid power device of the main amplifier includes a first output internal matching network configured to operate at the first frequency, the first output internal matching network including a first capacitor and being configured to transform an output impedance of the first power transistor die of the hybrid device of the main amplifier, and
the hybrid power device of the main amplifier includes a second output internal matching network configured to operate at the second frequency, the second output internal matching network including a second capacitor and being configured to transform an output impedance of the second power transistor die of the hybrid device of the main amplifier.

15. The amplifying structure of claim 14 wherein,
the first output internal matching network includes a first plurality of inner bonding wires connecting the first capacitor to the first power transistor die of the hybrid device of the main amplifier and a first plurality of outer bonding wires connecting the first capacitor to a first drain lead, and
the second output internal matching network includes a second plurality of inner bonding wires connecting the second capacitor to the second power transistor die of the hybrid device of the main amplifier and a second plurality of outer bonding wires connecting the second capacitor to a second drain lead.

16. The amplifying structure of claim 1 wherein,
the hybrid power device of the peak amplifier includes a first input internal matching network configured to operate at the first frequency, the first input internal matching network including a first capacitor and being configured to transform an input impedance of the first power transistor die of the hybrid device of the peak amplifier, and
the hybrid power device of the peak amplifier includes a second input internal matching network configured to operate at the second frequency, the second input internal matching network including a second capacitor and being configured to transform an input impedance of the second power transistor die of the hybrid device of the peak amplifier.

17. The amplifying structure of claim 16 wherein,
the first input internal matching network includes a first plurality of inner bonding wires connecting the first capacitor to the first power transistor die of the hybrid device of the peak amplifier and a first plurality of outer bonding wires connecting the first capacitor to a first gate lead, and
the second input internal matching network includes a second plurality of inner bonding wires connecting the second capacitor to the second power transistor die of the hybrid device of the peak amplifier and a second plurality of outer bonding wires connecting the second capacitor to a second gate lead.

18. The amplifying structure of claim 1 wherein,
the hybrid power device of the peak amplifier includes a first output internal matching network configured to operate at the first frequency, the first output internal matching network including a first capacitor and being configured to transform an output impedance of the first power transistor die of the hybrid device of the peak amplifier, and
the hybrid power device of the peak amplifier includes a second output internal matching network configured to operate at the second frequency, the second output internal matching network including a second capacitor and being configured to transform an output impedance of the second power transistor die of the hybrid device of the peak amplifier.

19. The amplifying structure of claim 18 wherein,
the first output internal matching network includes a first plurality of inner bonding wires connecting the first capacitor to the first power transistor die of the hybrid device of the peak amplifier and a first plurality of outer bonding wires connecting the first capacitor to a first drain lead, and
the second output internal matching network includes a second plurality of inner bonding wires connecting the second capacitor to the second power transistor die of the hybrid device of the peak amplifier and a second plurality of outer bonding wires connecting the second capacitor to a second drain lead.

20. The amplifying structure of claim 1, wherein one or more of the hybrid device of the main amplifier and the hybrid device of the peak amplifier include one or more low-temperature co-fired creaming (LTCC) integrated circuits for implementing integrated input and output matching networks with both or either of the main and the peak hybrid power devices.

* * * * *